United States Patent [19]
Doshi et al.

[11] Patent Number: 6,066,545
[45] Date of Patent: May 23, 2000

[54] BIRDSBEAK ENCROACHMENT USING COMBINATION OF WET AND DRY ETCH FOR ISOLATION NITRIDE

[75] Inventors: Vikram Doshi; Hiroshi Ono; Takayuki Niuya; Hayato Deguchi, all of Plano, Tex.

[73] Assignee: Texas Instruments Incorporated, Dallas, Tex.

[21] Appl. No.: 09/207,086

[22] Filed: Dec. 7, 1998

Related U.S. Application Data

[60] Provisional application No. 60/067,986, Dec. 9, 1997.

[51] Int. Cl.⁷ ...................................................... H01L 21/76

[52] U.S. Cl. ........................... 438/439; 438/225; 438/297; 438/362

[58] Field of Search .................................. 438/225, 297, 438/362, 439

[56] References Cited

U.S. PATENT DOCUMENTS 5,039,625  8/1991  Reisman et al. ......................... 438/439
5,702,978  12/1997  Gabriel et al. ......................... 438/439

*Primary Examiner*—Charles Bowers
*Assistant Examiner*—David S Blum
*Attorney, Agent, or Firm*—Jacqueline J. Garner; W. James Brady, III; Frederick J. Telecky, Jr.

[57] ABSTRACT

A technique for reducing active area encroachment (birdsbeak) by using a polysilicon hard mask combined with both wet and dry etch for the isolation nitride. This process forms a thinner layer of nitride adjacent the openings for oxide growth, which reduces stress at the silicon/nitride interface. The advantages include control over birdsbeak, reliable gate oxide quality, low junction leakage current, an improved active area, improved isolation, low peripheral junction leakage, and higher field transistor threshold voltage.

4 Claims, 8 Drawing Sheets

BIRDSBEAK ENCROACHMENT USING COMBINATION OF WET AND DRY ETCH FOR ISOLATION NITRIDE

This application claims priority under 35 USC § 119 (e)(1) of provisional application number 60/067,986, filed Dec. 9, 1997.

BACKGROUND AND SUMMARY OF THE INVENTION

The present invention relates to integrated circuit structures and fabrication methods and specifically to improving the encroachment of the field oxide into the active areas and reduce stress in the silicon near the field oxide.

BACKGROUND: FORMATION OF FIELD OXIDE

A common isolation technique for integrated circuits is the so-called LOCOS process, or Local Oxidation of Silicon. This technique depends on the fact that silicon nitride is impervious to oxygen diffusion and can be used as a mask against oxidation. Thus, if a bare silicon wafer is covered with a nitride layer which then has openings etched in it, a subsequent oxidation step will grow oxide only where the nitride is removed.

A problem with the conventional LOCOS method is the stress caused in the silicon substrate due to a) the mismatch of thermal expansion coefficients of the substrate and of the nitride, and b) the volumetric increase of the growing oxide. Because of the high stress at the nitride/silicon interface, dislocations in the silicon at corners of the openings in the nitride layer occur often during subsequent oxide growth. To prevent this problem, as shown in FIG. 2, a thin layer of thermal oxide 110 (known as a pad or buffer oxide) is generally used between the nitride 120 and the silicon substrate 100. When the dielectric isolation area 130 is subsequently formed, oxygen diffusion through the pad oxide and along the interface can cause additional oxide growth under the nitride. This additional oxide growth gives rise to an encroachment area 140, also known as a "birdsbeak", of the active area.

The encroachment area (birdsbeak) affects device performance in two significant ways. First, the encroachment reduces the active width of the device, thereby reducing the amount of current the transistor can drive. Second, the field oxidation causes subsequent field implant of dopants to diffuse out of the edge of the active region. If the transistor is narrow enough, the diffused dopant will increase the threshold voltage of the device, thereby reducing its current drive.

One previous solution to the birdsbeak intrusion has been to form a nitride sidewall, as shown in FIG. 3, to prevent oxygen diffusion through the pad oxide.

The current process used for LOCOS is good for up to 16 M DRAM (0.5 micron design rule). In the 64 M DRAM level (0.3 micron design rule), the issue arises of a large bird's beak at the edge of a long moat which is critical for contact to the storage node. As seen in FIG. 8A, the moat area has been so encroached by the oxide that overlap of the storage node contact area is minimal. In FIG. 8B, under the disclosed method, the encroachment is reduced, allowing the moat to completely overlap the contact area A thick birdsbeak is not good for the storage node contact (SNCT) etch, but a simple thick nitride does not solve the problem because it induces stress leading to silicon crystal damage. Thus, it is desirable to reduce the birdsbeak without creating stress.

Modification of Isolation Nitride Etch

The present application discloses a technique for reducing active area encroachment (birdsbeak) by using a "trapezoid nitride process." This process uses the combination of a polysilicon hard mask and wet etch for the nitride, followed by a dry etch to produce a trapezoidal nitride profile as shown in FIG. 7. Having a nitride that is thinner at the edges reduces stress at the interface, particularly in the horizontal direction (the active area width).

The advantages of the disclosed methods and devices formed by the disclosed methods include:
 does not cause dislocation in the substrate;
 uses known methods and tools;
 provides reliable gate oxide quality;
 provides low junction leakage current;
 simulations achieved 9 percent stress reduction in silicon layer;
 improved active area;
 improved isolation with low peripheral junction leakage and higher field transistor threshold voltage;
 improved yield in probe test, including;
 designed size of active area, as seen in the area masked, can be decreased since there is less encroachment; and
 cell-to-cell spacing can be decreased.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Isolation Nitride Etch

Figure 1:
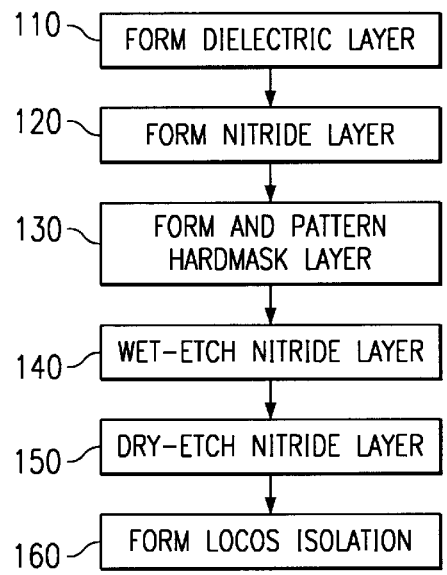
FIG. 1 shows a process flow for fabrication of LOCOS isolation using the disclosed trapezoidal nitride layer.
Figure 2:
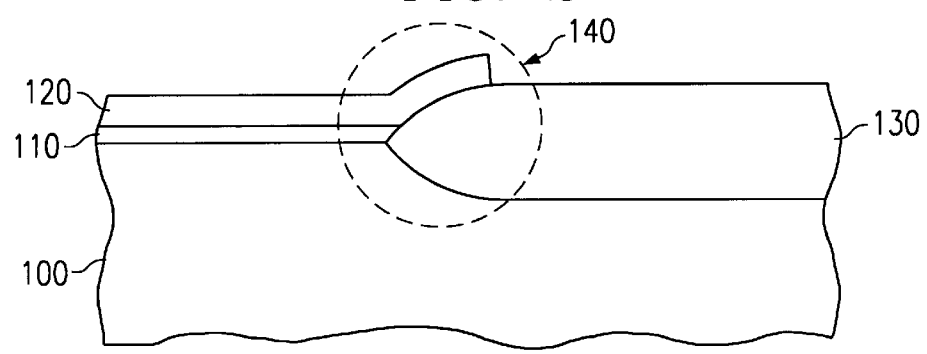
FIG. 2 shows a conventional structure with LOCOS isolation and the resultant active area encroachment (birdsbeak).
Figure 3:
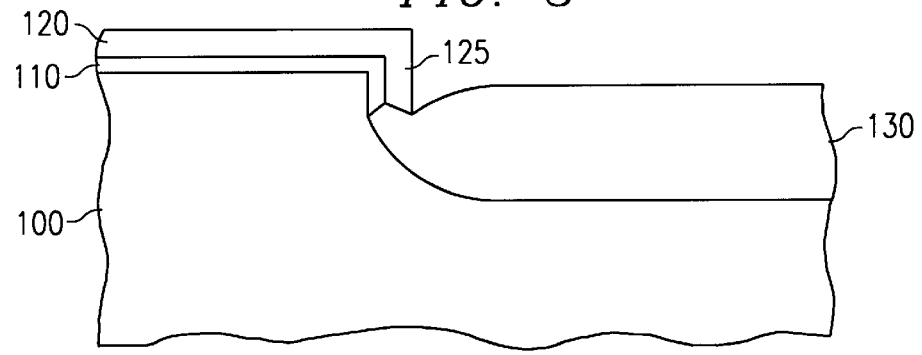
FIG. 3 shows a prior solution to the birdsbeak encroachment.

FIG. 1 is a process flow for fabrication of an integrated circuit device. The steps in FIG. 1 will now be discussed in an overview of the disclosed invention, with reference to FIGS. 4–7. Details and specific examples are discussed below in a sample embodiment.

The first step in the process involves forming (step 110) a thin dielectric layer 210 over a semiconductor substrate 200, followed by deposition (step 120) of nitride layer 220. A hardmask layer 230 is formed and patterned (step 130) over nitride layer 220, resulting in the structure shown in FIG. 4.

Figure 5:
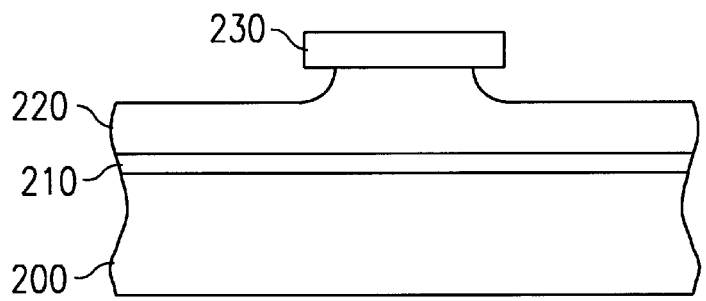

Nitride layer 220 is then wet etched, (step 140), resulting in the structure shown in FIG. 5. Nitride layer 220 is then dry etched (step 150), resulting in the structure shown in FIG. 6. This trapezoidal nitride layer is used to mask the oxidation step (step 160), and provides better control of the encroachment, as well as the other advantages listed above. FIG. 7 shows the wafer surface after oxidation, after which the nitride layer is stripped and the remaining integration proceeds according to methods known in the art.

Sample Embodiment

Details and specific examples of one embodiment of the process flow will now be discussed.

Figure 4:
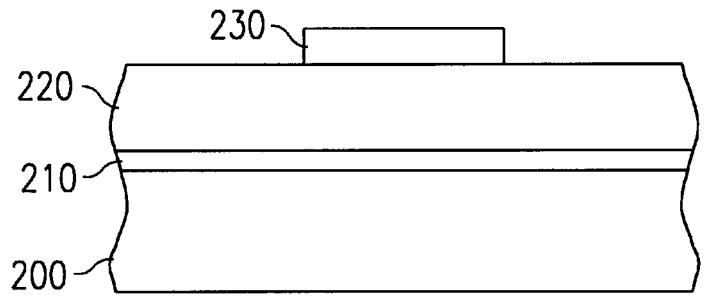
FIGS. 4–7 illustrate various stages in the disclosed process.

Referring to FIG. 4, semiconductor substrate 200 is silicon. Thin dielectric layer 210 is silicon dioxide, grown 8–11 nm thick in this sample embodiment. Silicon nitride layer 220 is 100–200 nm thick, deposited by a low pressure-chemical vapor deposition (LPCVD) process using mixtures of dichlorosilane and ammonia, and a deposition temperature of 700–900 degrees C Polysilicon layer 230 is deposited to a thickness of 100 nm and patterned with resist, which is then removed.

In FIG. 5, an isotropic wet etch is performed on silicon nitride layer 220. The etchant in this sample embodiment is phosphoric acid (H3PO4) preferably at 145 degrees C, although it can be performed in the range of 140–200 degrees C., to remove the corner of the nitride at the edges of the hardmask. The wet etch is performed in an automated wet bench process, with the sequence (a.) HF @ 25 degrees C., (b.) de-ionized water rinse, (c.) H3PO4 @ 145 degrees C., (d.) H3PO4 @ 145 degrees C.; (e.) de-ionized water rinse; (f.) spin dry.

Figure 6:
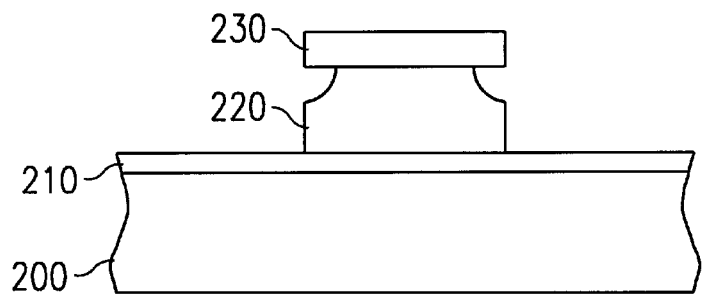
Figure 7:
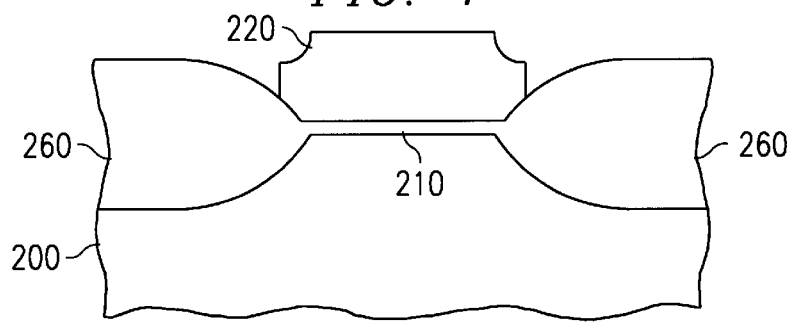
Figure 8A:
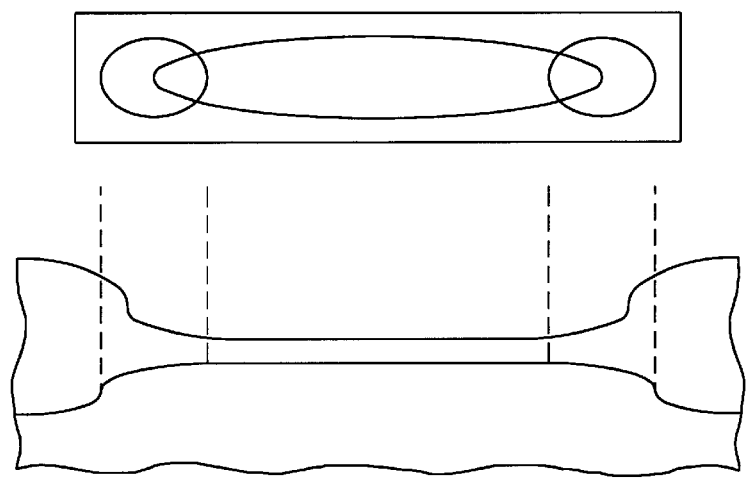
FIG. 8A shows how the moat area is decreased in previous methods, making contact with the storage node more difficult.
Figure 8B:
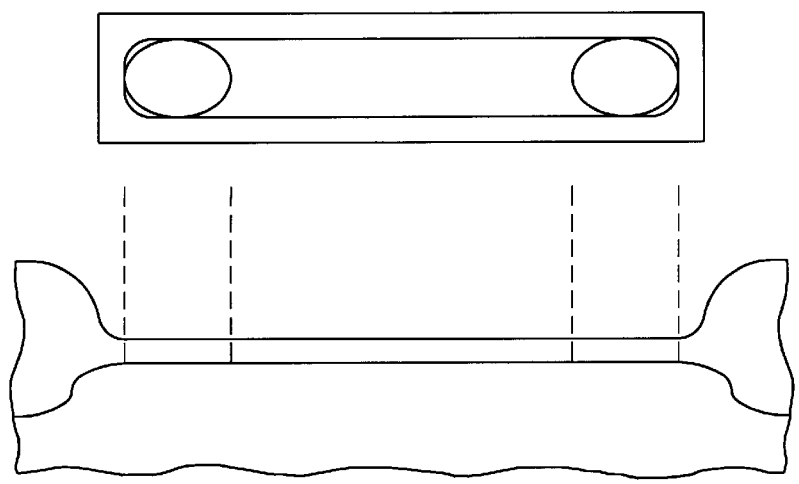
FIG. 8B shows the moat area and storage node under the disclosed method, where the contact overlap is much greater.

Referring to FIG. 6, an anisotropic dry etch is performed on silicon nitride layer 240. For selectivity of the nitride to the underlying oxide, a plasma etch process which is rich in atomic fluorine is used, such as a CF4-O2 plasma. This etch would typically be performed at a frequency of 13.56 MHz and an operating pressure of 200 mT. However, a variety of suitable dry etch processes are readily apparent to one skilled in the art. The oxide is then grown by known methods, giving the structure shown in FIG. 7.

Alternative Embodiment: TEOS Hardmask

In an alternative embodiment, tetraethylorthosilicate (TEOS) is used in a low pressure CVD process to form the hardmask.

Alternative Embodiment: Silicon-Germanium Substrate

In an alternative embodiment, semiconductor substrate is silicon-germanium rather than silicon as in the sample embodiment. Other conditions remain similar to those stated above.

Alternative Embodiment: PECVD Nitride Deposition

In an alternative embodiment, silicon nitride layer 220 is deposited by plasma-enhanced-chemical vapor deposition process. The process is run at 300–400 degrees C. using a mixture of argon or helium, silane, and either ammonia or nitrogen. Other conditions remain similar to those stated above.

Simulations

Simulations of the disclosed process have been run, and the results are shown in FIGS. 9–13.

Figure 9A:
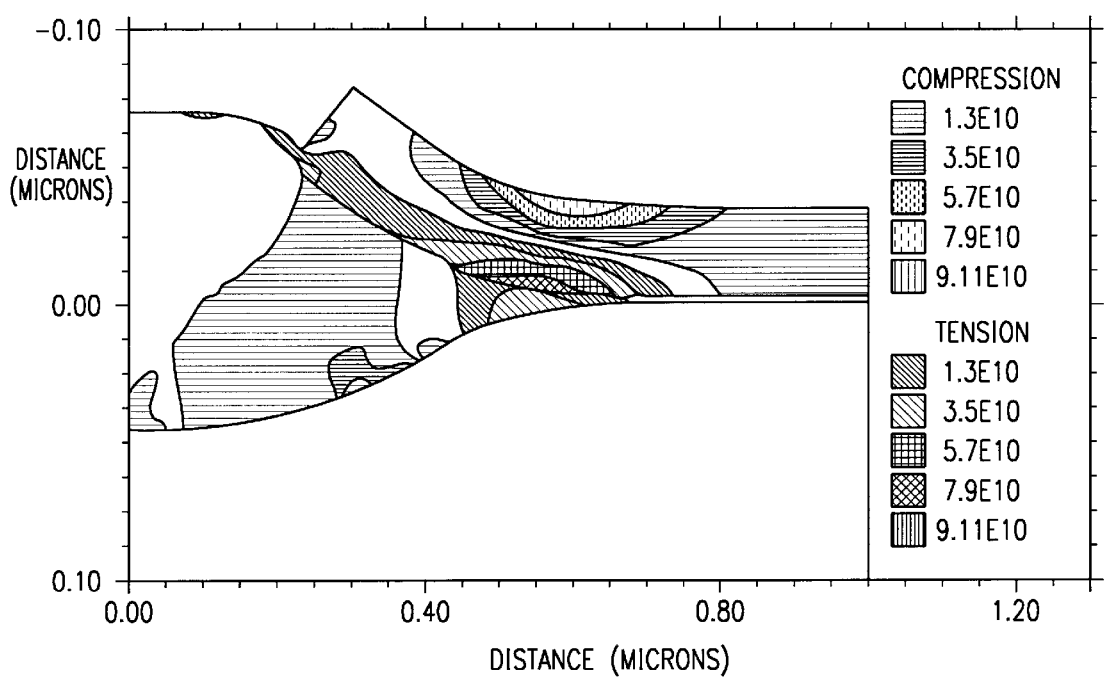
FIGS. 9A–9B show LOCOS stress simulations for a conventional nitride with a thickness of 130 nm and a trapezoidal-shaped nitride with a main thickness of 130 nm and with 30 nm removed by the isotropic etch.
Figure 9B:
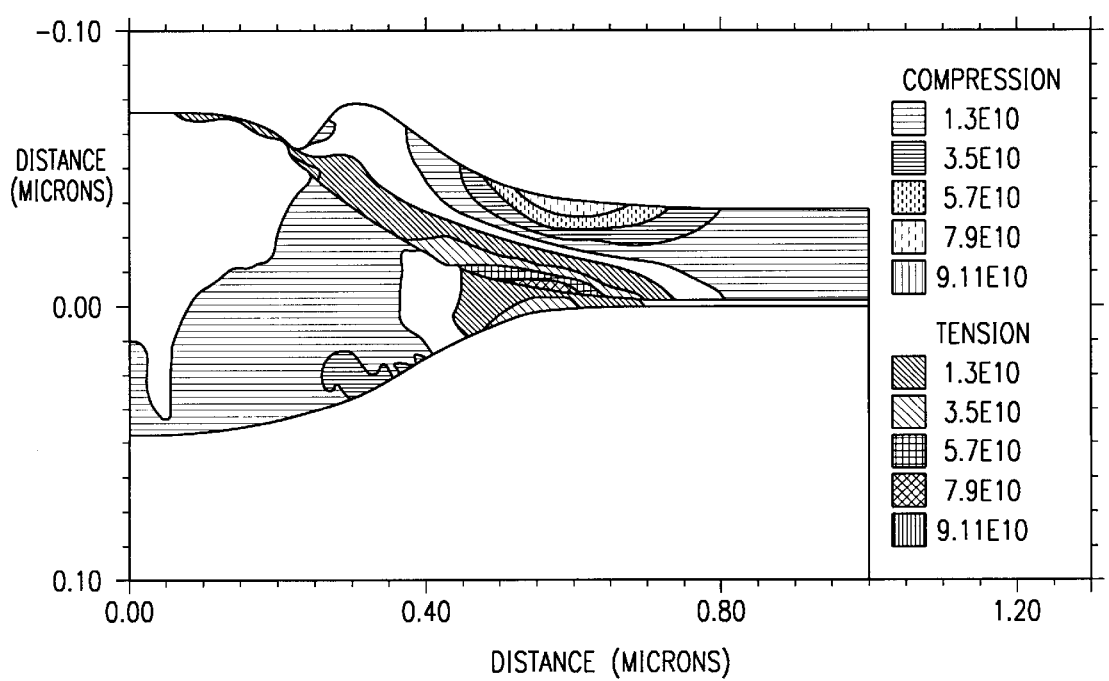
Figure 10A:
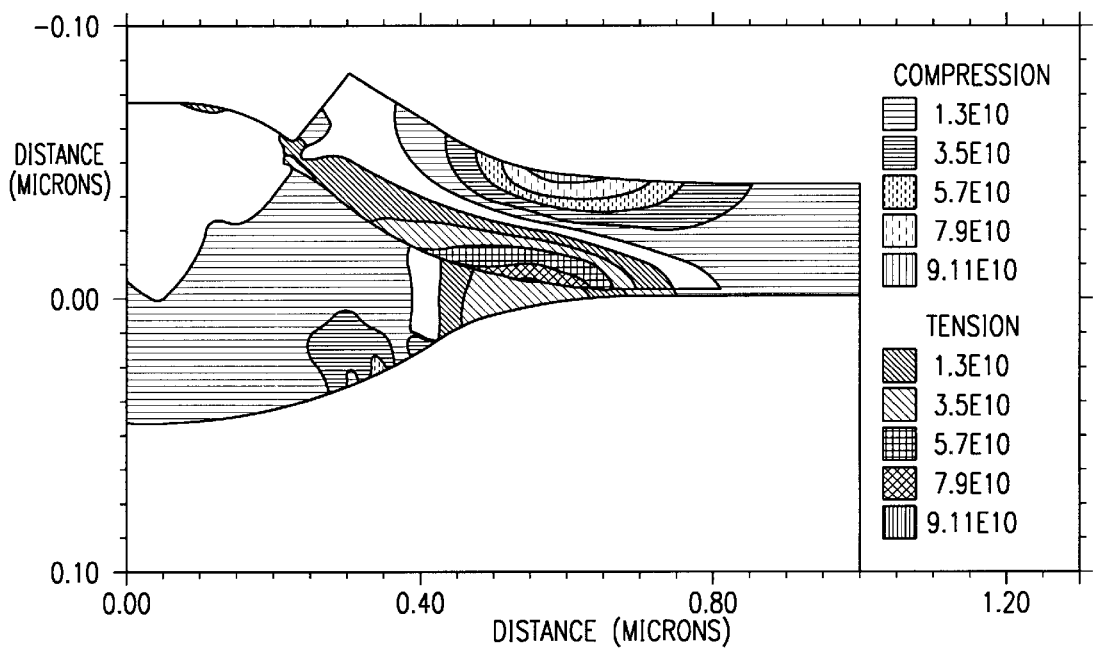
FIGS. 10A–10D show LOCOS stress simulations for a conventional nitride with a thickness of 160 nm and a trapezoidal-shaped nitride with a main thickness of 160 nm and with 60, 80, and 100 nm respectively removed by the isotropic etch.
Figure 10B:
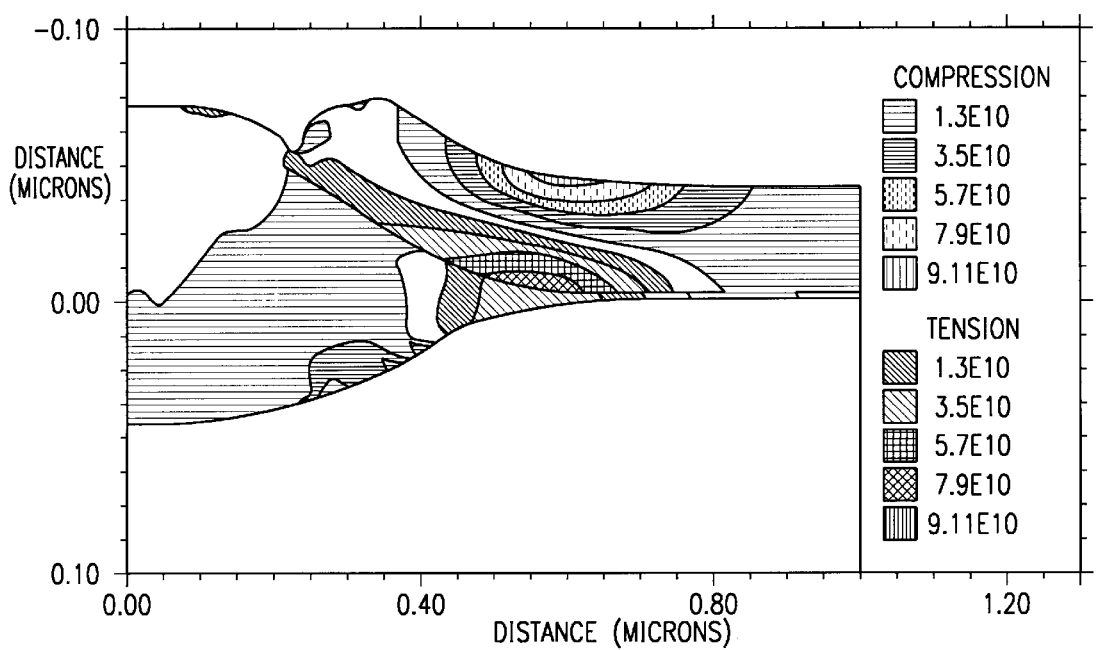
Figure 10C:
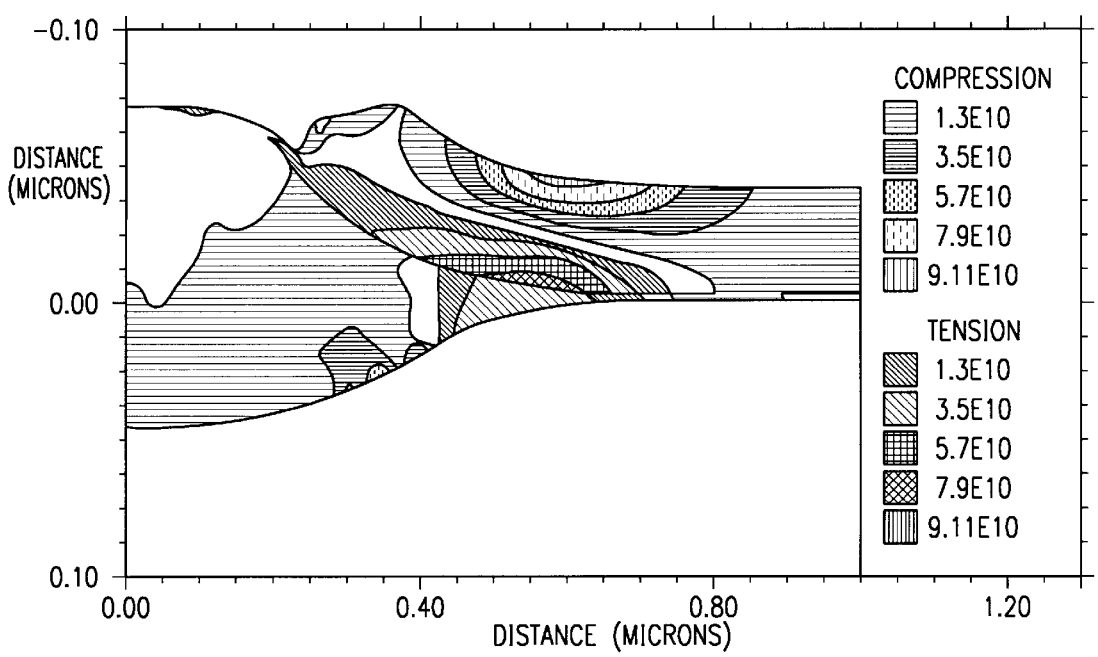
Figure 10D:
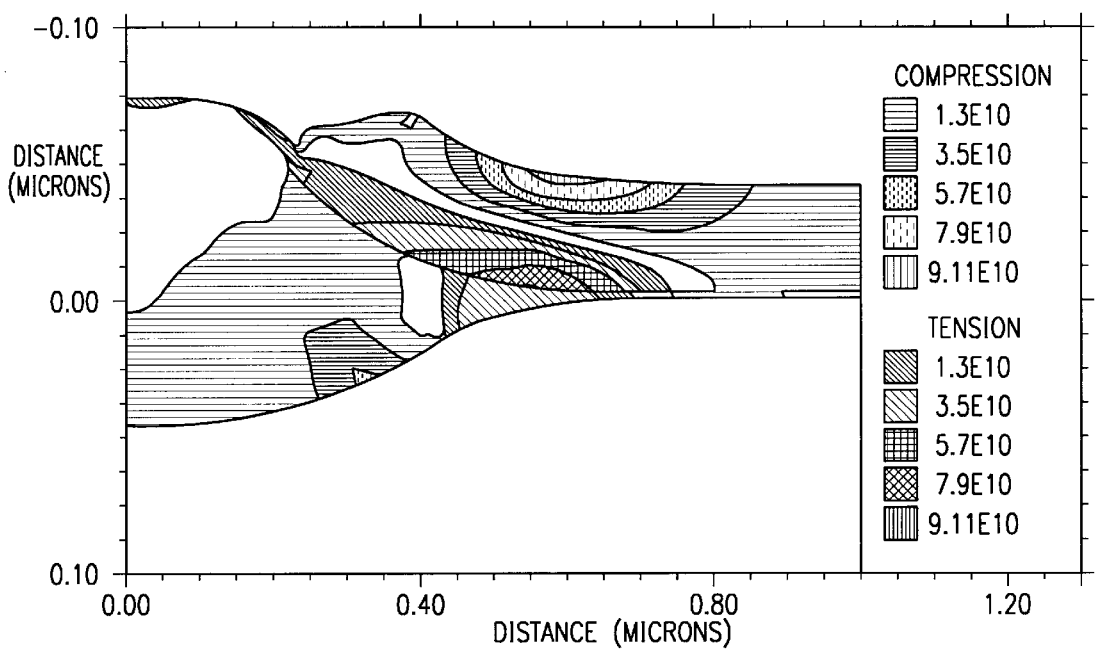

FIGS. 9A–9B show LOCOS stress simulations for a conventional nitride with a thickness of 130 nm and a trapezoidal-shaped nitride with a main thickness of 130 nm and with 30 nm removed by the isotropic etch.

FIGS. 10A–10D show LOCOS stress simulations for a conventional nitride with a thickness of 160 nm and a trapezoidal-shaped nitride with a main thickness of 160 nm and with 60, 80, and 100 nm respectively removed by the isotropic etch.

Figure 11A:
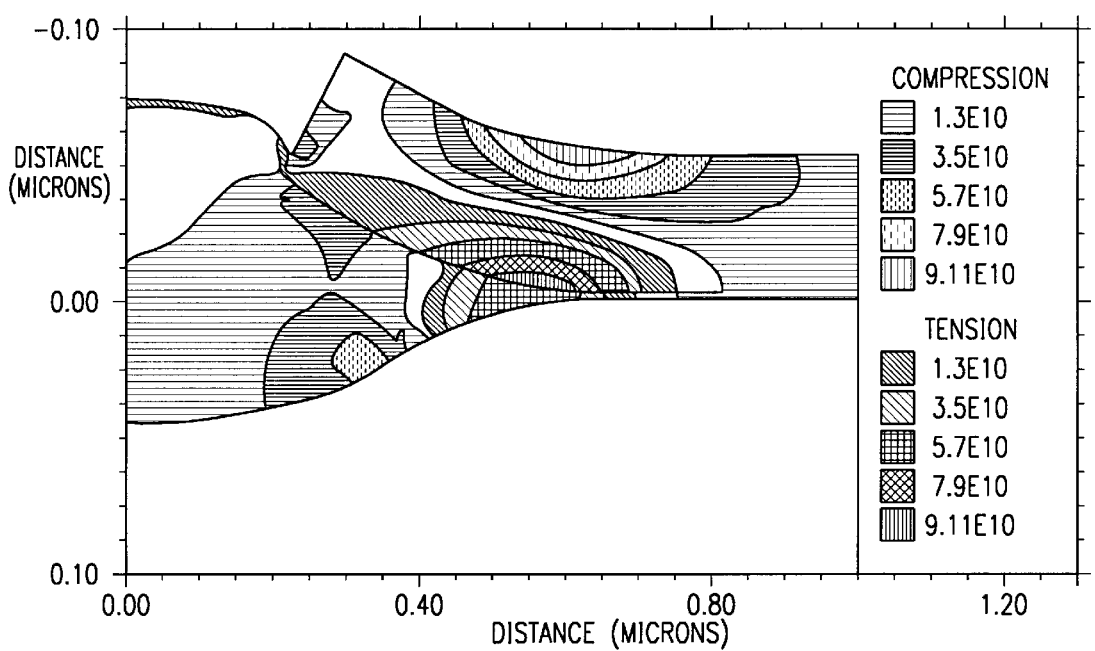
FIGS. 11A–11B show LOCOS stress simulations for a conventional nitride with a thickness of 200 nm and a trapezoidal-shaped nitride with a main thickness of 200 nm and with 100 nm removed by the isotropic etch.
Figure 11B:
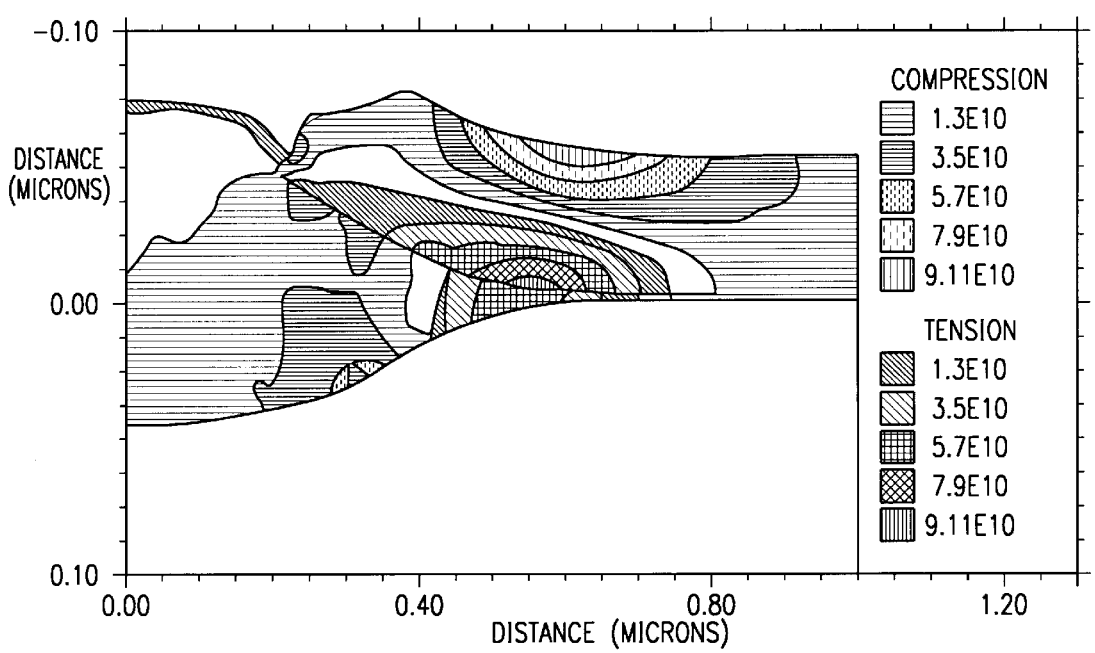

FIGS. 11A–11B show LOCOS stress simulations for a conventional nitride with a thickness of 200 nm and a trapezoidal-shaped nitride with a main thickness of 200 nm and with 100 nm removed by the isotropic etch.

Figure 12:
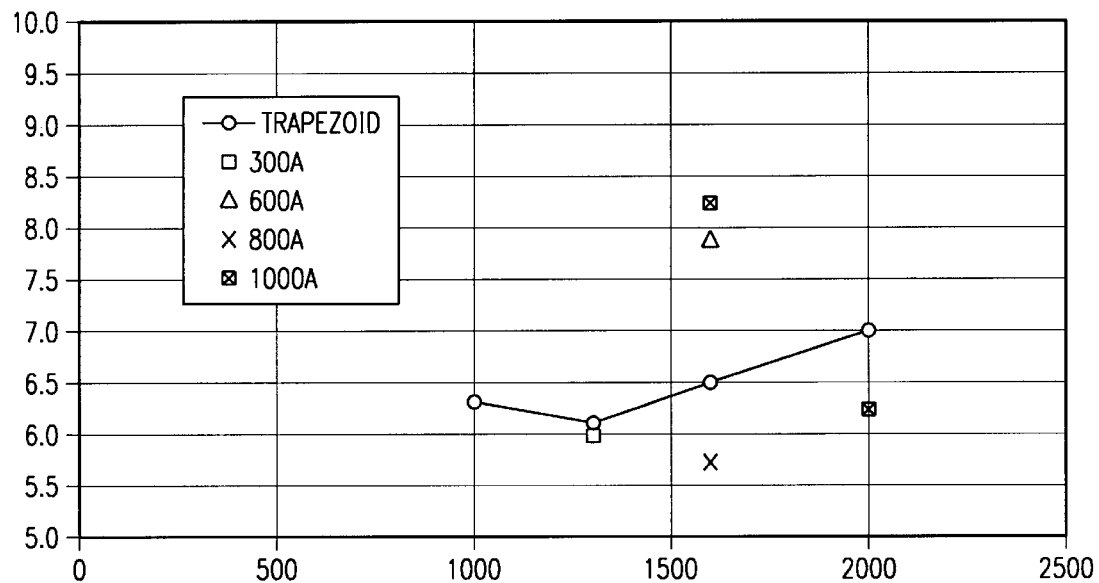
FIG. 12 shows a graph of nitride thickness versus tensile stress for both conventional nitrides and the disclosed trapezoidal-shaped nitrides.

FIG. 12 shows a graph of nitride thickness versus tensile stress for both conventional nitrides and the disclosed trapezoidal-shaped nitrides. Baseline for conventional nitrides is shown by the black line, while values for various amounts removed by the isotropic etch are shown by the coded points.

Figure 13:
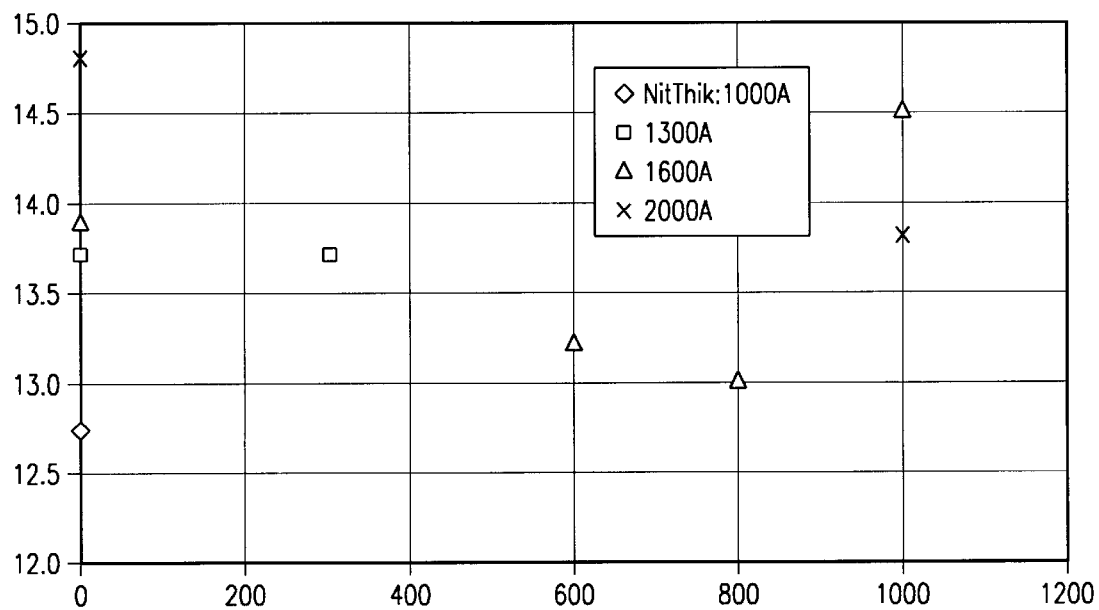
FIG. 13 shows a graph of the thickness of the nitride layer at the edges of the layer versus the compressive stress.

FIG. 13 shows a graph of the thickness of the nitride layer removed at the edges of the layer versus the compressive stress. Two or more values are given for each thickness, that of a conventional layer with no trapezoidal etch done, and for the disclosed process in which a trapezoidal shape is formed.

It is evident from these results that varying the removal of nitride at the edge of the layer does not uniformly cause lowered stress, but that careful selection of amounts of nitride to be removed at the edges can provide a beneficial result. In this example, for a nitride with a thickness of 160 nm, reduction of the edge by 800 nm produces a lowering of compressive stress from 13.9 to 13 (a 6.5 percent reduction) and of tensile stress from 6.5 to 5.7 (a 12 percent reduction).

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The disclosed process is also applicable to other modified LOCOS processes, such as poly-buffered LOCOS or Sidewall-Masked Isolation (SWAMI).

Similarly, it will be readily recognized that the described process steps can also be embedded into hybrid process flows, such as BiCMOS or smart-power processes.

What is claimed is:

1. A fabrication method for intergrated circuits, comprising the steps of:

(a.) forming a nitride layer over a thermal oxide which overlies a semiconductor material;

(b.) forming a hardmask layer over said nitride layer;

(c.) forming openings in said hardmask layer in locations where isolation structures are desired;

(d.) partially etching said nitride layer, through said openings in said hardmask layer, with a primarily isotropic etch; and (e.) after said step (d.), anisotropically etching said nitride layer through said openings in said hardmask layer, to expose portions of said thermal oxide.

2. The fabrication method of claim 1, wherein said nitride layer is silicon nitride.

3. The fabrication method of claim 1, wherein said semiconductor material comprises monocrystalline silicon.

4. The fabrication method of claim 1, further comprising (f.) oxidizing said semiconductor material to form field oxides, using remaining portions of said nitride layer as a mask; whereby said field oxides have a reduced birdsbeak encroachment into said active area.

* * * * *